United States Patent
Roberts et al.

(10) Patent No.: US 8,499,116 B2
(45) Date of Patent: Jul. 30, 2013

(54) MANAGING WEAR ON INDEPENDENT STORAGE DEVICES

(75) Inventors: David Andrew Roberts, Ann Arbor, MI (US); Jichuan Chang, Sunnyvale, CA (US); Parthasarathy Ranganathan, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 480 days.

(21) Appl. No.: 12/813,772

(22) Filed: Jun. 11, 2010

(65) Prior Publication Data

US 2011/0307679 A1 Dec. 15, 2011

(51) Int. Cl.
G06F 12/00 (2006.01)
(52) U.S. Cl.
USPC .......................................................... 711/103
(58) Field of Classification Search
None
See application file for complete search history.

(56) References Cited

U.S. PATENT DOCUMENTS

| 5,341,339 | A | 8/1994 | Wells |
| 7,353,325 | B2 | 4/2008 | Lofgren et al. |
| 7,921,256 | B2 * | 4/2011 | Im .................................. 711/103 |
| 2010/0318719 | A1 * | 12/2010 | Keays et al. .................. 711/103 |

* cited by examiner

Primary Examiner — Brian Peugh

(57) ABSTRACT

In a method of managing wear on a plurality of independent storage devices having respective sets of memory cells, access characteristics of the memory cells in the plurality of independent storage devices are monitored. In addition, an instruction to access data on at least one of the memory cells is received and an independent storage device of the plurality of independent storage devices is selected to access data on at least one of the memory cells of the selected independent storage device based upon one or more predetermined selection policies and the monitored access characteristics of the memory cells in the plurality of independent storage devices. Moreover, the selected independent storage device is assigned to access data on at least one of the memory cells of the selected independent storage device according to the received instruction.

20 Claims, 6 Drawing Sheets

US 8,499,116 B2

MANAGING WEAR ON INDEPENDENT STORAGE DEVICES

BACKGROUND

Increasingly, modern computing devices employ solid-state, non-volatile memory, which are configured to be repetitively reprogrammed. An example of these types of memory is flash, which is comprised of a large number of floating-gate field effect transistors arranged as memory cells. Each memory cell includes a floating gate positioned over a substrate channel between source and drain regions. A thin oxide layer separates the floating gate from the substrate. The threshold level of the cell is controlled by an amount of charge that is placed on the floating gate. If the charge level is above some threshold, the cell is read to have one state, and if below that threshold, is read to have another state. The memory cells, like typical erasable programmable read only memory (EPROM) cells, but in contrast to dynamic random access memory (DRAM), retain information when power is removed.

Non-volatile storage has many advantages for a large number of applications. However, the cells in these devices have a much more limited endurance or erase/write cycles (that is, the number of times they can be reprogrammed or erased) than DRAM. A cell's storage material will deteriorate after it passes the write cycle limit, and cannot be further reprogrammed. The useful lifetime of the cell is at that point considered to have ended. Non-volatile storage devices and systems using such devices often deploy wear-leveling techniques to evenly spread the write requests across physical storage elements on the device, to avoid premature device failure due to limited endurance.

BRIEF DESCRIPTION OF THE DRAWINGS

Features of the present invention will become apparent to those skilled in the art from the following description with reference to the figures, in which.

DETAILED DESCRIPTION

Figure 1:
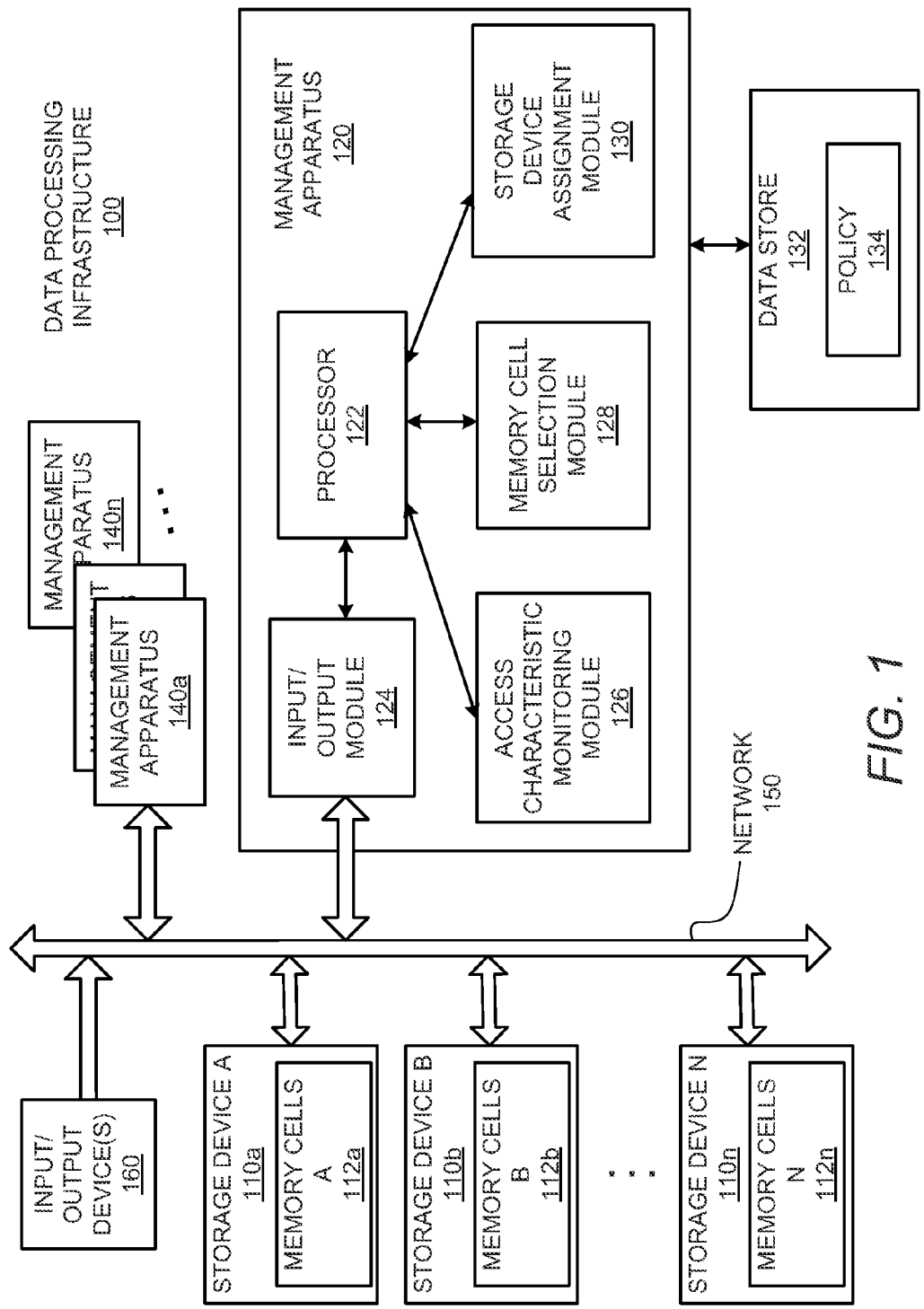
FIG. 1 depicts a simplified block diagram of a data management infrastructure, according to an example embodiment of the invention.

For simplicity and illustrative purposes, the present invention is described by referring mainly to an example embodiment thereof. In the following description, numerous specific details are set forth in order to provide a thorough understanding the embodiments. It will be apparent however, to one of ordinary skill in the art, that the present invention may be practiced without limitation to these specific details. In other instances, well known methods and structures have not been described in detail so as not to unnecessarily obscure the embodiments.

Disclosed herein are a method and apparatus for managing wear on a plurality of independent storage devices having respective sets of memory cells. As disclosed herein, an independent storage device of the plurality of independent storage devices is selected to access (read and/or manipulate) data on at least one of the cells of the selected independent storage device based upon one or more predetermined selection policies and monitored access characteristics of the memory cells in the plurality of independent storage devices. The one or more predetermined policies are designed to enable management of the lifetimes of the independent storage devices to, for instance, maximize the lifetimes of all of the independent storage devices, maximize the lifetimes of selected ones of the independent storage devices by selecting other ones of the independent storage devices to be accessed with a greater level of frequency, etc. The one or more predetermined policies may also be designed to manage the lifetimes of the independent storage devices in association with other management metrics such as performance, power efficiency and reliability, In addition, other considerations, such as, the storage device types, intended applications of the storage devices, replication of data among the storage devices, access characteristics of memory cells of storage devices in other clusters, etc., may be factored in selecting the independent storage device to at least one of read and manipulate data on at least one of the memory cells of the selected independent storage device. The method and system disclosed herein may also be implemented with existing wear-leveling systems that manage a single device, either agnostically or collaboratively, to achieve additive benefits.

Through implementation of the method and apparatus disclosed herein, the storage devices may be operated to cause predetermined ones of the storage devices to fail prior to other ones of the storage devices. Thus, for instance, the storage devices located in more readily accessible locations in an infrastructure may be operated to fail prior to storage devices located in less readily accessible locations. As another example, groups of storage devices, or all the devices as a whole replacement unit, may be operated to fail around the same time to thus enable storage device replacement to be performed at the same time for a number of storage devices, which may reduce management costs. In addition, the method and apparatus disclosed herein enable for failures of the storage devices to be relatively accurately predicted to thereby enable useful data to be migrated to other storage devices prior to failure of the storage devices.

With reference first to FIG. 1, there is shown a simplified block diagram of a data management infrastructure 100, according to an example. It should be understood that the data management infrastructure 100 may include additional components and that one or more of the components described herein may be removed and/or modified without departing from a scope of the data management infrastructure 100.

Generally speaking, the data management infrastructure 100 comprises one or more apparatuses for managing reading and manipulation of data among a plurality of storage devices 110a-110n having respective memory cells 112a-112n, where n is a value greater than 1. As used throughout the present disclosure, "manipulation" generally refers to at least one of writing data to, erasing data from, and rewriting data onto the memory cells 112a-112n. As discussed in greater detail herein below, the access, such as reading from and manipulation of, on the memory cells 112a-112n is controlled to meet the requirements of one or more predetermined policies.

The data management infrastructure 100 may comprise a single apparatus, such as a server or a memory array containing a plurality of the storage devices 110a-110n. The infrastructure 100 may be a cluster of the apparatuses, such as a cluster of servers and/or memory arrays, in which the apparatuses include one or more of the storage devices 110a-110n. As another example, the infrastructure 100 may be one or more data centers containing a relatively large number of apparatuses, in which the apparatuses include one or more of the storage devices 110a-110n.

As further discussed herein each of the storage devices 110a-110n is independent from each of the other storage devices 110a-110n because the memory cells 112a-112n in each of the storage devices 110a-110n are physically separate from each other and are independently addressable with respect to each other. In this regard, each of the storage devices 110a-110n may have local processing units (not shown) configured to control access to their respective memory cells 112a-112n. In addition, although the storage devices 110a-110n have been described herein as having memory cells 112a-112n, the memory cells 112a-112n may equivalently be termed as bits, memory blocks, or other equivalent terms for defining discrete locations in the storage devices 110a-110n in which data is at least one of read and manipulated.

The storage devices 110a-110n may comprise any of various types of storage devices, such as, solid-state disks, disk caches, flash memories, etc. In addition, the storage devices 110a-110n may be volatile or non-volatile, replaceable or irreplaceable, storage devices. Moreover, the storage devices 110a-110n may be homogeneous with respect to each other or two or more of the storage devices 110a-110n may be heterogeneous with respect to each other.

Also shown in FIG. 1 is a management apparatus 120 configured to manage operations of the storage devices 110a-110n. The management apparatus 120 is depicted as including a processor 122, and input/output module 124, an access characteristic monitoring module 126, a memory cell selection module 128, and a storage device assignment module 130. The modules 124-130 may comprise hardware and/or software that the processor 122 implements or executes in managing the operations of the storage devices 110a-110n. According to an example, the modules 124-130 comprise software modules stored, for instance, in a volatile or non-volatile memory, such as DRAM, EEPROM, MRAM, phase change RAM (PCRAM), Memristor, flash memory, floppy disk, a CD-ROM, a DVD-ROM, or other optical or magnetic media, and the like. According to another example, the modules 124-130 comprise one or more hardware devices, such as, a circuit or multiple circuits arranged on a board. According to a further example, the modules 124-130 comprise a combination of hardware and software modules.

The management apparatus 120 may comprise a computing device, for instance, a server or an array of storage devices containing the storage devices 110a-110n; or software modules running on such devices. In another example, the management apparatus 120 may comprise a computing device that is separate from a server or an array of storage devices containing the storage devices 110a-110n that the management apparatus 120 is configured to manage. For instance, the management apparatus 120 may comprise a personal computer, a laptop computer, a personal digital assistant (PDA), a mobile telephone, a printing device, etc. As a further example, the management apparatus 120 may comprise a network switch or router configured to route traffic of data through one or more networks.

In any regard, the management apparatus 120 is configured to access a data store 132 in managing the storage devices 110a-110n. More particularly, for instance, instructions pertaining to one of more policies 134 that the management apparatus 120 is to implement may be stored in the data store 132. The data store 132 may comprise volatile and/or non-volatile memory, such as DRAM, EEPROM, MRAM, phase change RAM (PCRAM), Memristor, flash memory, and the like. In addition, or alternatively, the data store 132 may comprise a device configured to read from and write to a removable media, such as, a floppy disk, a CD-ROM, a DVD-ROM, or other optical or magnetic media.

As also shown in FIG. 1, the management apparatus 120 is configured to communicate with the storage devices 110a-110n through a network 150. By way of particular example, the management apparatus 120 is configured to receive data, such as, metadata, pertaining to access characteristics and other information of the storage devices 110a-110n that the management apparatus 120 uses in managing operation of the storage devices 110a-110n through the network 150. The network 150 may comprise a local area network, a wide area network, the Internet, etc., and may be a wired or a wireless network. Alternatively, however, the network 150 may comprise a bus, for example, in instances where the data processing infrastructure comprises a single apparatus, such as, a server or an array of storage devices.

In addition, the management apparatus 120 is configured to communicate with one or more input/output devices 160 over the network 150. The input/output devices 160 may comprise, for instance, personal computers, laptop computers, personal digital assistants (PDAs), mobile telephones, printing devices, etc. In one regard, the input/output devices 160 are configured to read and write to the storage devices 110a-110n and the management apparatus 120 is configured to monitor activity on the storage devices 110a-110n and to move blocks of data around among the storage devices 110a-110n, either locally or across one or more clusters as discussed in greater detail herein below.

In responding to the instructions from the input/output device(s) 160, the processor 122 is configured to manage the operations of the plurality of independent storage devices 110a-110n to comply with one or more predetermined management policies. More particularly, for instance, the processor 122 is configured to implement the modules 124-130 in selecting one or more of the memory cells 112a-112n to be at least one of read and manipulated according to one or more predetermined selection policies as discussed in greater detail herein below.

As also shown in FIG. 1, the management apparatus 120 may communicate with one or more other management apparatuses 140a-140n, which may each be configured similarly to the management apparatus 120. As such, the management apparatuses 140a-140n may each manage operations of their own respective groups of storage devices 110a-110n. In this regard, the management apparatuses 140a-140n and their respective storage devices 110a-110n may be considered as being in separate clusters. In addition or alternatively, one or more of the management apparatuses 140a-140n may be in a different hierarchical level as compared with the management apparatus 120 and may thus receive and/or transmit data from the management apparatus 120. In any regard, the management apparatuses 120, 140a-140n may be configured to share data pertaining to various characteristics and statistics of the storage devices 110a-110n contained in their respective clusters, such as, in the form of metadata. For instance, the management apparatuses 120, 140a-140n may be configured to communicate information pertaining to the total capacity, write bandwidth, read and write bandwidth limits, cluster wear leveling efficiency, etc., of the storage devices 110a-110n contained in their respective clusters. In addition, or alternatively, the management apparatuses 120, 140a-140n may be configured to collect and communicate information pertaining to the following example information:

- the number of accesses per memory cell 112a-112n,
- the failed memory cell counts of the storage devices 110a-110n,
- whether the storage devices 110a-110n in their respective clusters are replaceable or non-replacement units,
- available capacity per storage device 110a-110n,
- failed bits per data block, erase block, non-replaceable unit, replaceable unit, server, rack, cluster,
- desired lifetimes of the storage devices 110a-110n,
- data access patterns per unit (such as, locality, sequential/non-sequential, read/write),
- power consumption, access energy, idle power of the storage devices 110a-110n,
- access latencies, buffer sizes, buffer miss rates of the storage devices 110a-110n,
- internal storage device 110a-110n topologies, such as, number of banks, bus widths, interleaving policies, wear-leveling policies,
- local wear leveling efficiency.

As discussed in greater detail herein below, the management apparatuses 120, 140a-140n may employ this information in selecting which of the storage devices 110a-110n are to be at least one of read and manipulated.

In any regard, the management apparatuses 120, 140a-140n may be configured to query one or more of the other management apparatuses 120, 140a-140n for data pertaining to operational management decisions made by the other management apparatuses 120, 140a-140n. In addition, or alternatively the management apparatuses 120, 140a-140n may be configured to broadcast the data to the other management apparatuses 120, 140a-140n.

Various manners in which the processors 122 of one or more of the management apparatuses 120, 140a-140n may manage operations of a plurality of independent storage devices 110a-110n may operate are discussed in greater detail herein below with respect to the following flow diagrams.

Figure 2:
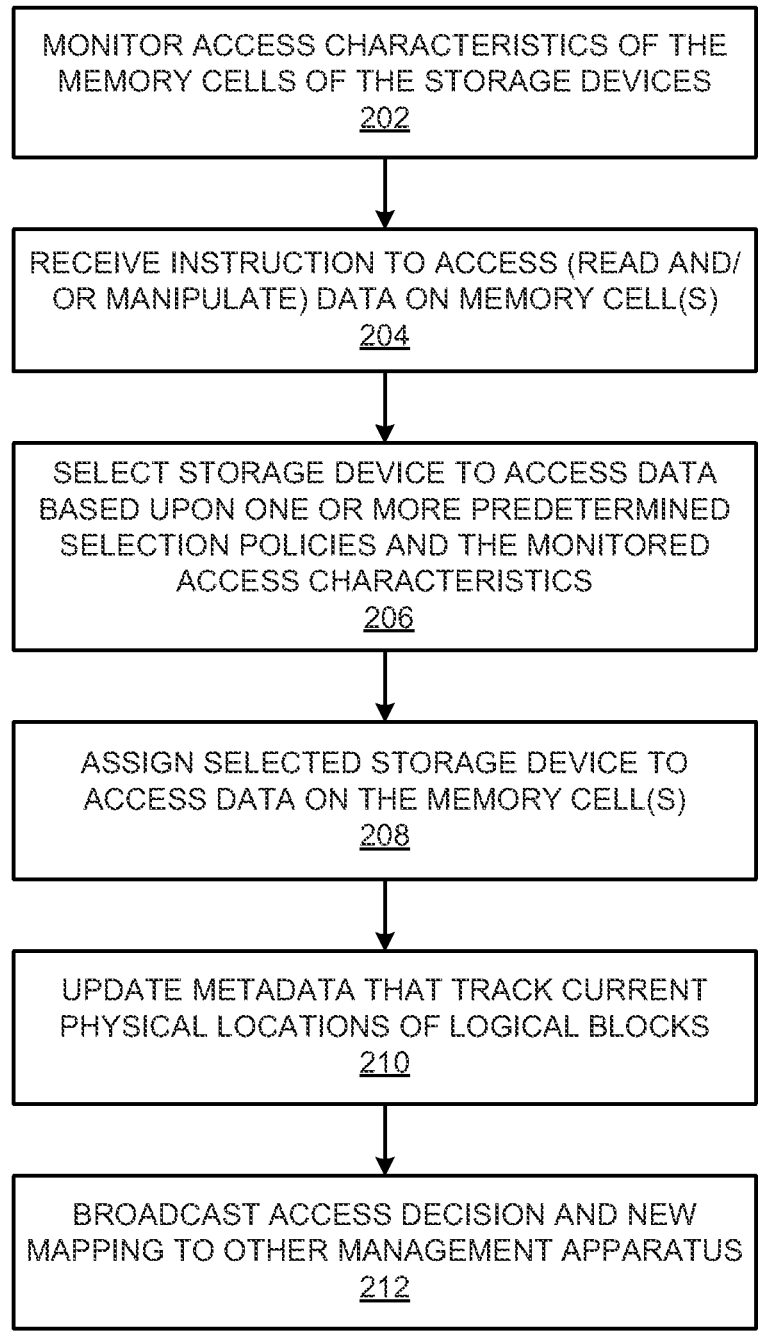
FIG. 2 depicts a flow diagram of a method for managing wear on a plurality of independent storage devices having respective sets of memory cells, according to an example embodiment of the invention.

Turning first to FIG. 2, there is shown a flow diagram of a method 200 for managing operation of a plurality of independent storage devices 110a-110n having respective sets of memory cells 112a-112n, according to an example. It should be understood that the method 200 may include additional steps and that one or more of the steps described herein may be removed and/or modified without departing from a scope of the method 200.

The description of the method 200 is made with reference to the data processing infrastructure 100 depicted in FIG. 1 and thus makes particular reference to the elements contained in the infrastructure 100. It should, however, be understood that the method 200 may be implemented in an infrastructure that differs from the infrastructure 100 without departing from a scope of the method 200.

As shown in FIG. 2, at step 202, access characteristics of the memory cells 112a-112n of the storage devices 110a-110n are monitored, for instance, by the processor 122. The access characteristics of the memory cells 112a-112n may include one or more of the number of times each of the memory cells 112a-112n is at least one of written to, read from, erased, failed, etc. According to an example, the storage devices 110a-110n may track the access characteristics of their respective memory cells 112a-112n and may report the tracked access characteristics to the management apparatus 120. More particularly, for instance, the storage devices 110a-110n may store the tracked access information in the form of metadata and may communicate the metadata to the management apparatus 120 through the network 150.

The management apparatus 120 may receive the tracked access characteristics data from the storage devices 110a-110n through the input/output module 124 and may store the data in the data store 132. In addition, the processor may implement the access characteristic monitoring module 126 to monitor the access characteristics of the memory cells 112a-112n in the storage devices 110a-110n based upon the information received from the storage devices 110a-110n. The management apparatus 120 may also receive information from one or more other management apparatuses 140a-140n that are configured to manage other clusters of storage devices 110a-110n and may store that information in the data store 132. By way of particular example, the access characteristic monitoring module 126 may track which of the storage devices 110a-110n are near their respective useful lives from the information received from the storage devices 110a-110n.

At step 204, an instruction to access (read and/or manipulate) data on at least one of the memory cells 112a-112n in at least one of the storage devices 110a-110n is received. By way of example, an input/output device 160 may communicate an instruction to the management apparatus 120 to one of read and manipulate data on at least one of the memory cells 112a-112n. As discussed above, the term "manipulate" generally refers to at least one of writing data to, erasing data from, and rewriting data to the memory cells 112a-112n.

At step 206, a storage device 110a of the plurality of storage devices 110a-110n is selected to access data on at least one of the memory cells 112a-112n of the selected independent storage device based upon the monitored access characteristics of the memory cells 112a-112n in the plurality of independent storage devices 110a-110n and in accordance with one or more predetermined selection policies 134. For instance, the processor 122 is configured to implement the memory cell selection module 128 to select the storage device 110a at step 206. In addition, the one or more predetermined selection policies 134 may be stored in the data store 132 in the form of instructions that the processor 122 is configured to implement.

According to a first example, the one or more predetermined selection policies 134 comprise a selection policy configured to level wear of the memory cells 112a-112n relatively evenly across the storage devices 110a-110n in one or more clusters to cause the storage devices 110a-110n in the one or more clusters to fail at substantially similar times. In other words, the first selection policy is designed to prolong the useful lives of the storage devices 110a-110n by substantially evenly distributing the wear on the memory cells 112a-112n of a plurality of storage devices 110a-110n. In addition, the one or more predetermined selection policies may comprise a selection policy designed to manage lifetimes of the independent storage devices in associated with at least one of performance, power efficiency, and reliability. In other words, the one or more predetermined selection policies may include a selection policy that optimizes at least one of performance, power efficiency, and reliability of the storage devices 110a-110n while managing wear on the storage devices 110a-110n.

Figure 3:
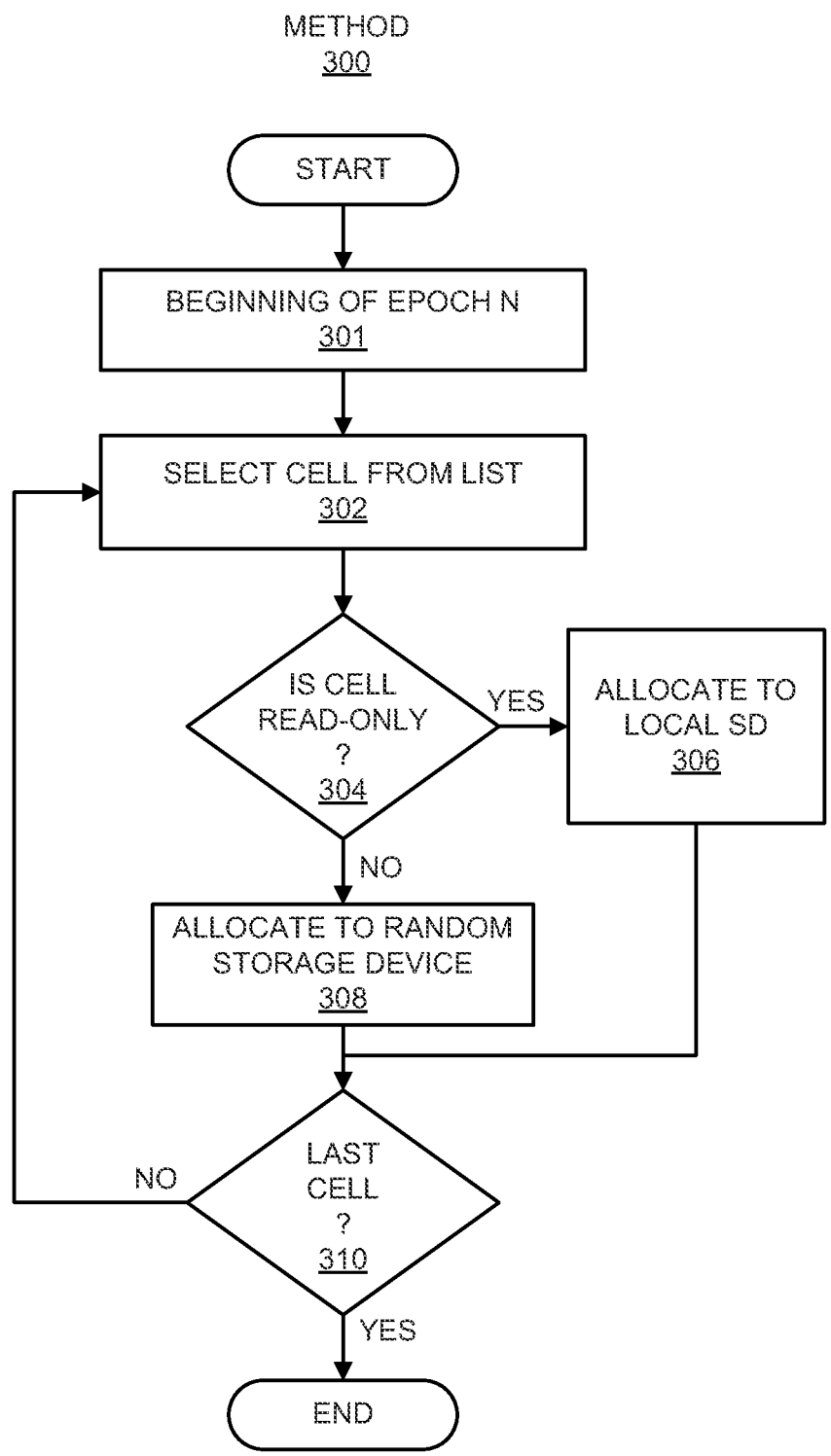
FIG. 3 depicts a flow diagram of a method in which the storage device selected in the method depicted in FIG. 2 is selected randomly, according to an example embodiment of the invention.

In one embodiment, the predetermined selection policy is configured to cause the processor 122 to randomly select the storage device 110a at step 206 (FIG. 2). A flow diagram of a method 300 in which the processor 122 randomly selects the storage device 110a at step 206 is depicted in FIG. 3, according to an example. It should be understood that the method 300 may include additional steps and that one or more of the steps described herein may be removed and/or modified without departing from a scope of the method 300.

The method 300 may be implemented across the data processing infrastructure 100 depicted in FIG. 1. In this regard, the storage devices 110a-110n within a cluster of the management apparatus 120 is considered to be local to the management apparatus 120. Moreover, the processor 122 of the management apparatus 120 is capable of instructing processors of the other clusters of management apparatuses 140a-140n to manipulate data on their storage devices 110a-110n.

As depicted therein, at step 301, the processor 122 begins an epoch (or iteration) N, for instance, in response to receipt of an instruction to at least one of read and manipulate data on at least one of the memory cells 112a-112n (FIG. 2, step 204). The epoch N may be a prior period of time over which access statistics were gathered and used in the method 300. At step 302, the processor 122 selects a memory cell 112a from a list of available memory cells 112a-112n of the storage devices 110a-110n in its cluster. At step 304, the processor 122 determines whether the selected memory cell 112a is a read-only memory cell. In response to a determination that the memory cell 112a is a read-only memory cell, the processor 122 allocates the manipulation of the data to a local storage device 110a-110n, as indicated at step 306. However, in response to a determination that the memory cell 112a is not a read-only memory cell, the processor 122 allocates the manipulation of the data to a random storage device 110a-110n, which may be a local storage device 110a or a storage device that is outside of the management apparatus 120 cluster.

Following either of steps 306 and 308, the processor 122 determines whether the allocated memory cell is the last memory cell to be manipulated according to the instructions received at step 204 (FIG. 2). In response to a determination that the allocated memory cell is not the last memory cell, and thus additional memory cells are to be manipulated, the processor 122 selects another memory cell 110b from the list at step 302. In addition, the processor 122 repeats steps 302-310 until the processor 122 determines that the allocated memory cell at step 310 is the last memory cell to be manipulated according to the instructions received at step 204 (FIG. 2), at which point, the method 300 may end.

In another embodiment, the predetermined selection policy is configured to cause the processor 122 to select the storage device 110a at step 206 (FIG. 2) according to a local storage device 110a-110n first manipulation prioritized scheme. A flow diagram of a method 400 in which the processor 122 follows this embodiment at step 206 is collectively depicted in FIGS. 4A and 4B, according to an example. It should be understood that the method 400 may include additional steps and that one or more of the steps described herein may be removed and/or modified without departing from a scope of the method 400.

Figure 4A:
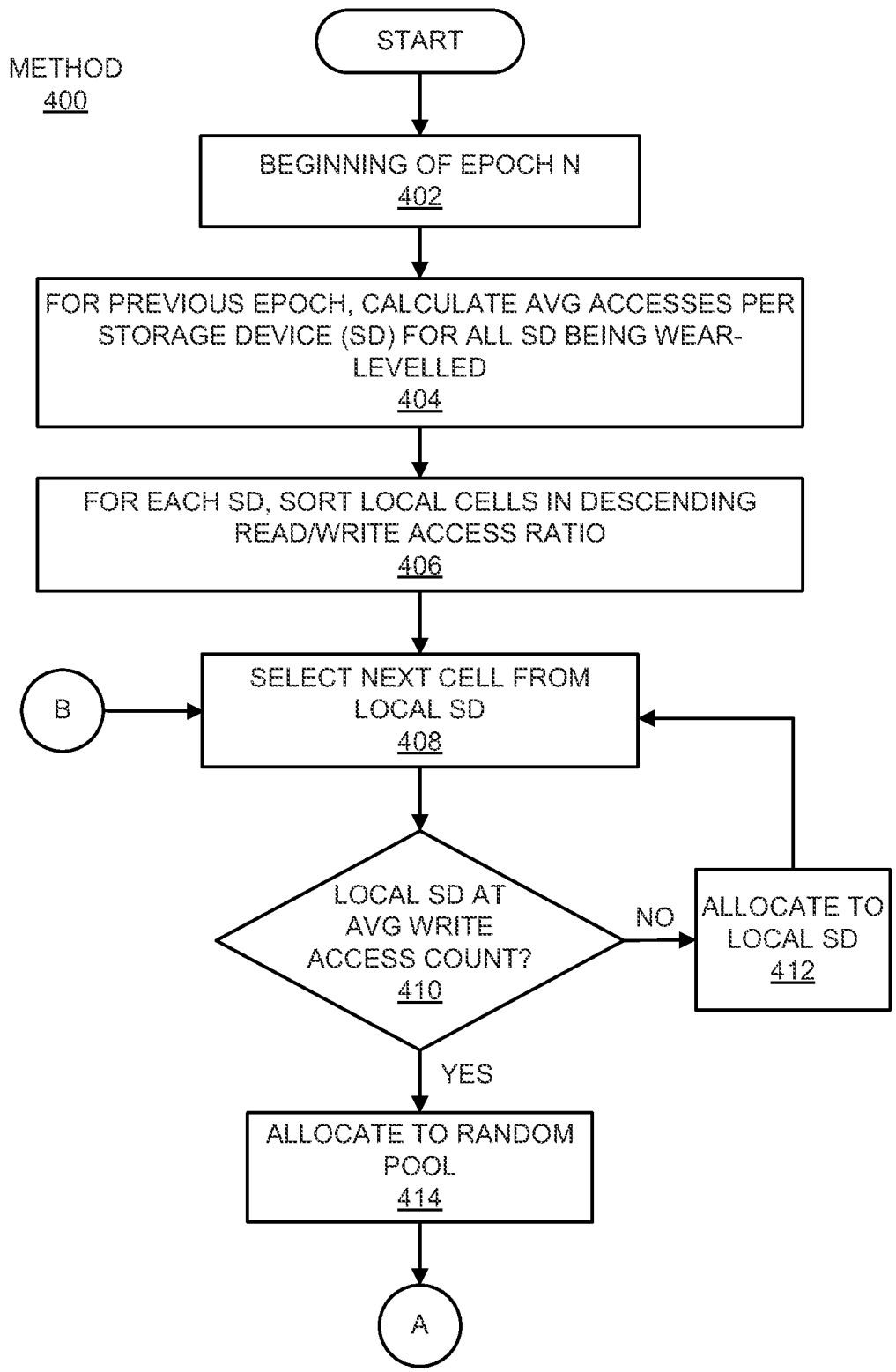
FIGS. 4A and 4B, collectively, depict a flow diagram of a method in which the storage device selected in the method depicted in FIG. 2 is selected according to a local storage device first manipulation prioritized scheme, according to an example embodiment of the invention.
Figure 4B:
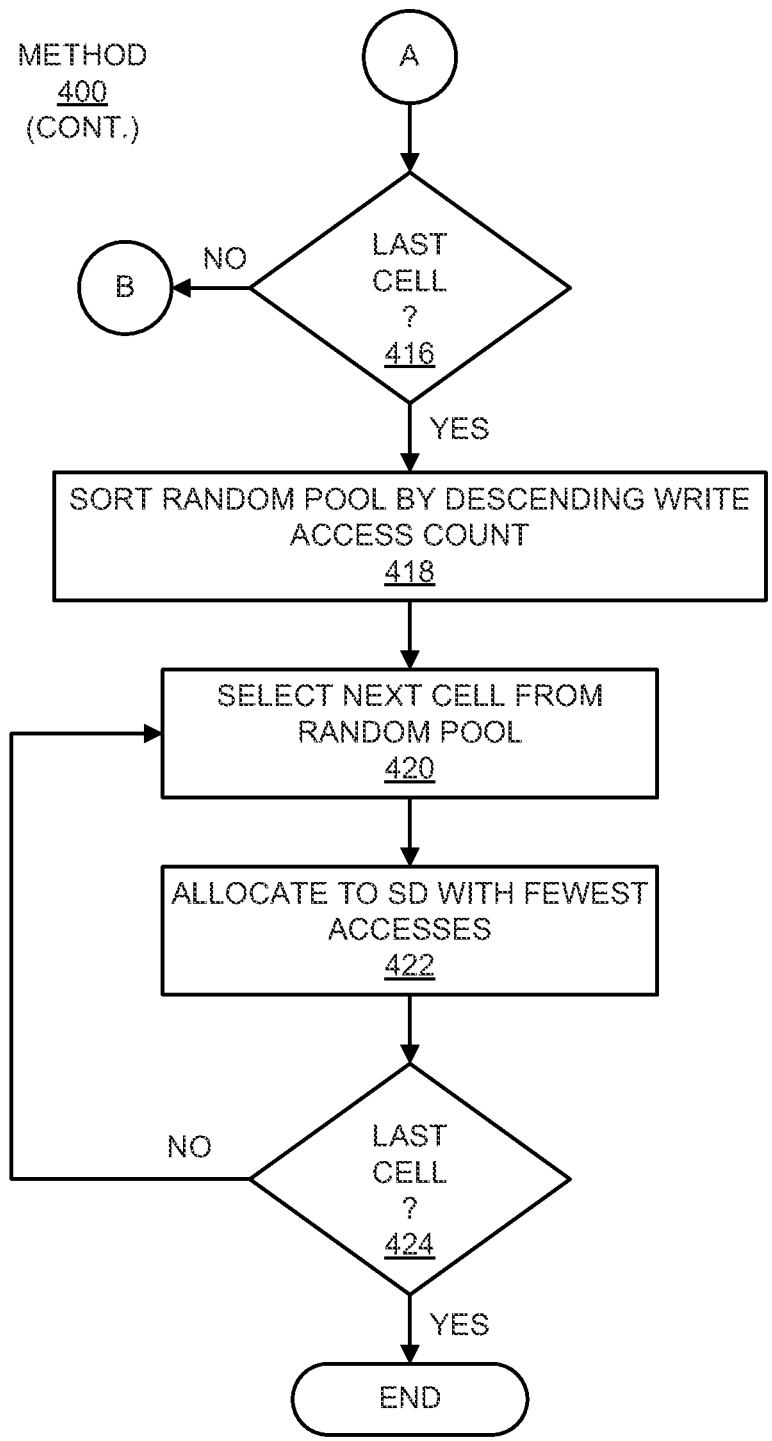

As depicted in FIG. 4A, at step 402, the processor 122 begins an epoch N, for instance, in response to receipt of an instruction to at least one of read and manipulate data on at least one of the memory cells 112a-112n (FIG. 2, step 204). The epoch N may be a prior period of time over which access statistics were gathered and used in the method 400. At step 404, for a previous epoch (N−1), the processor 122 calculates an average number of accesses, for instance, writes, reads, erases, and/or re-writes, per storage device 110a-110n for all of the storage devices 110a-110n being wear-leveled. The processor 122 may calculate the average number of accesses from the monitored access characteristics at step 202 (FIG. 2) stored in the data store 132 (FIG. 1). In addition, at step 406, the processor 122 sorts the memory cells 112a-112n of the local storage devices 110a-110n in descending read/write access ratio. The processor 122 may thus sort the memory cells 112a-112n of the local storage devices 110a-110n in order with the memory cells 112a-112n having the lowest number of accesses being at the top of the list.

At step 408, the processor 122 selects the next memory cell 112a-112n in the sorted memory cells 112a-112n of a local storage device 110a-110n to at least one of read and manipulate. At step 410, the processor 122 determines whether the selected local storage device 110a is at the average write access count of the previous epoch. In response to the selected local storage device 110 not being at the average access count, the processor 122 allocates the instruction to at least one of the read and manipulate data to the local storage device 110a selected at step 408, as indicated at step 412. In addition, the processor 122 repeats steps 408-412 for a next memory cell 112b of the sorted memory cells 112a-112n, which may comprise a memory cell 112b located in a different local storage device 110a-110n.

If, however, the processor 122 determines that the selected local storage device 110 is at the average access count at step 410, the processor 122 allocates the access request to a random pool of storage blocks, as indicated at step 414. The random pool of storage blocks includes storage blocks that are outside of the cluster of the local storage devices 110a-110n. In addition, at step 416 (FIG. 4B), the processor 122 determines whether the selected memory cell 110a is the last cell of the selected local storage device 110a. In response to the selected memory cell 112a not being the last cell, the processor 122 selects a next cell from the selected local storage device 110a at step 408 and repeats steps 410-414.

In response to the selected memory cell 112a being the last cell, the processor 122 sorts the pool of storage blocks by descending access count as indicated at step 418. Alternatively, the random pool of storage blocks may be randomized. Again, the processor 122 may sort the memory cells 112a-112n of the storage devices 110a-110n in one or more clusters in order with the memory cells 112a-112n having the lowest number of accesses being at the top of the list. In addition, at step 420, the processor 122 selects a next memory cell 112b from the random pool. Moreover, at step 422, the processor 122 allocates the at least one of the read and manipulation of the data to the storage device 110b having the fewest number of accesses. The fewest number of accesses may be counted during the previous epoch or from the first use of a new drive, for example. If it is from the first use, this access count represents the current level of wear-out of the drive. In practice, the historical access counts may be weighted with a higher weight on the more recent epochs (for example, an exponential moving average over time).

At step 424, the processor 122 determines whether there are additional cells to be at least one read and manipulated. In response to a determination that there is at least one additional cell, the processor 122 selects a next cell from the random pool at step 420 and allocates the next cell to the storage device 110c having the fewest accesses at step 422. The processor 122 is configured to repeat steps 420-424 until there are no further cells to be at least one of read and manipulated at step 424, at which point, the method 400 may end.

According to a second example, the one or more predetermined selection policies 134 comprise a selection policy configured to skew selection of the storage device 110a at step 206 (FIG. 2). In this example, the processor 122 may select the storage device 110*a* such that the memory cells 112*a*-112*n* of the selected storage device 110*a* are at least one of read and manipulated a greater number of times as compared with the memory cells 112*a*-112*n* of other ones of the storage devices 110*a*-110*n*. Thus, for instance, the processor 122 may cause the storage devices 110*a*-110*n* that are in relatively easily accessible locations of an infrastructure to undergo a greater number of read and/or manipulations as compared with storage devices 110*a*-110*n* located in more difficult to access locations, which may simplify maintenance of the storage devices 110*a*-110*n*. In another example, the processor 122 may cause groups of storage devices 110*a*-110*n* to fail around the same time to thus enable the groups of storage devices 110*a*-110*n* to be replaced at around the same time. In addition, or alternatively, the processor 122 may be able to predict which of the storage devices 110*a*-110*n* are likely to fail over a period of time and may thus migrate data from those storage devices 110*a*-110*n* to other storage devices 110*a*-110*n* prior to failure.

According to a third example, the one or more predetermined selection policies 134 comprise a selection policy configured to factor susceptibilities of heterogeneous storage devices in the selection of the storage device 110*a* at step 206 (FIG. 2). In this example, the storage devices 110*a*-110*n* comprise heterogeneous storage devices with respect to each other and have different useful lives. As such, for instance, the processor 122 may be configured to select the heterogeneous storage devices 110*a*-110*n* to cause the storage devices to fail at around the same time. As another example, the processor 122 may be configured to select the heterogeneous storage devices 110*a*-110*n* in a manner to cause one or more of the heterogeneous storage devices 110*a*-110*n* to fail sooner than other ones of the heterogeneous storage devices 110*a*-110*n*.

According to a fourth example, the one or more predetermined selection policies 134 comprise a selection policy configured to factor intended applications of the plurality of storage devices 110*a*-110*n* in the selection of the storage device 110*a* at step 206 (FIG. 2). In this example, one or more of the storage devices 110*a*-110*n* may be employed for different applications as compared with other ones of the storage devices 110*a*-110*n*. For instance, one or more of the storage devices 110*a*-110*n* may be implemented as cache memories, while other ones of the storage devices 110*a*-110*n* may be implemented as a non-volatile memory. In this example, the processor 122 may be configured to cause a greater number of reads and/or manipulations to occur in the storage devices 110*a*-110*n* that are implemented as non-volatile memories to thus cause all of the storage devices 110*a*-110*n* to fail at around the same time.

According to a fifth example, the one or more predetermined selection policies 134 comprise a selection policy configured to factor replication of data among multiple ones of the storage devices 110*a*-110*n* in the selection of the storage device 110*a* at step 206 (FIG. 2). For instance, the same data may be stored on the memory cells 112*a*-112*n* of multiple ones of the storage devices 110*a*-110*n* such that the data is retrievable from any one of those storage devices 110*a*-110*n*. In this example, the processor 122 may be configured to cause a greater number of reads and/or manipulations to occur on one of the storage devices 110*a* storing the same data as another one of the storage devices 110*b* to cause the storage device 110*a* to fail sooner than the other storage device 110*b*.

According to a sixth example, the one or more predetermined selection policies 134 comprise a selection policy configured to factor access characteristics of storage devices 110*a*-110*n* located in clusters other than the cluster in which the processor 122 is contained in the selection of the storage device 110*a* at step 206 (FIG. 2). In this example, the management apparatus 120 is configured to receive the access characteristic information from the other management apparatuses 140*a*-140*n* as discussed above. In addition, the processor 122 may be configured to select one or more of the storage devices 110*a*-110*n* in another cluster to read and/or manipulation data on its respective memory cells 112*a*-112*n*.

Although the examples above have been discussed separately from each other, it should be understood that various aspects of the above-discussed examples may be employed together without departing from a scope of the method 200.

With reference back to FIG. 2, following selection of the storage device 110*a* at step 206, the selected storage device 110*a* is assigned to access data on at least one of the memory cells 112*a*-112*n* of the selected memory device 110*a*, as indicated at step 208. For instance, the processor 122 may implement the storage device assignment module 130 to communicate an instruction to the selected storage device 110*a* to perform the instruction on one or more of its memory cells 112*a*-112*n*. In response, the selected storage device 110*a* is configured to cause the access to be performed on one or more of its memory cells 112*a*-112*n*. In addition, at step 210, the metadata that tracks current physical locations of logical blocks is updated. For instance, the metadata associated with the operating system file allocation tables may be updated at step 210. Moreover, following the update, the processor 122 may broadcast the access decision and new mapping to one or more other management apparatuses 140*a*-140*n*, as indicated at step 212.

Some or all of the operations set forth in the methods 200-400 may be contained as one or more utilities, programs, or subprograms, in any desired computer accessible or readable storage medium. In addition, one or more of the methods 200-400 may be embodied by a computer program, which may exist in a variety of forms both active and inactive. For example, one or more of the methods 200-400 may exist as software program(s) comprised of program instructions in source code, object code, executable code or other formats. Any of the above can be embodied on a computer readable storage medium.

Exemplary computer readable storage devices or medium include conventional computer system RAM, ROM, EPROM, EEPROM, and magnetic or optical disks or tapes. Concrete examples of the foregoing include distribution of the programs on a CD ROM or via Internet download. It is therefore to be understood that any electronic device capable of executing the above-described functions may perform those functions enumerated above.

Figure 5:
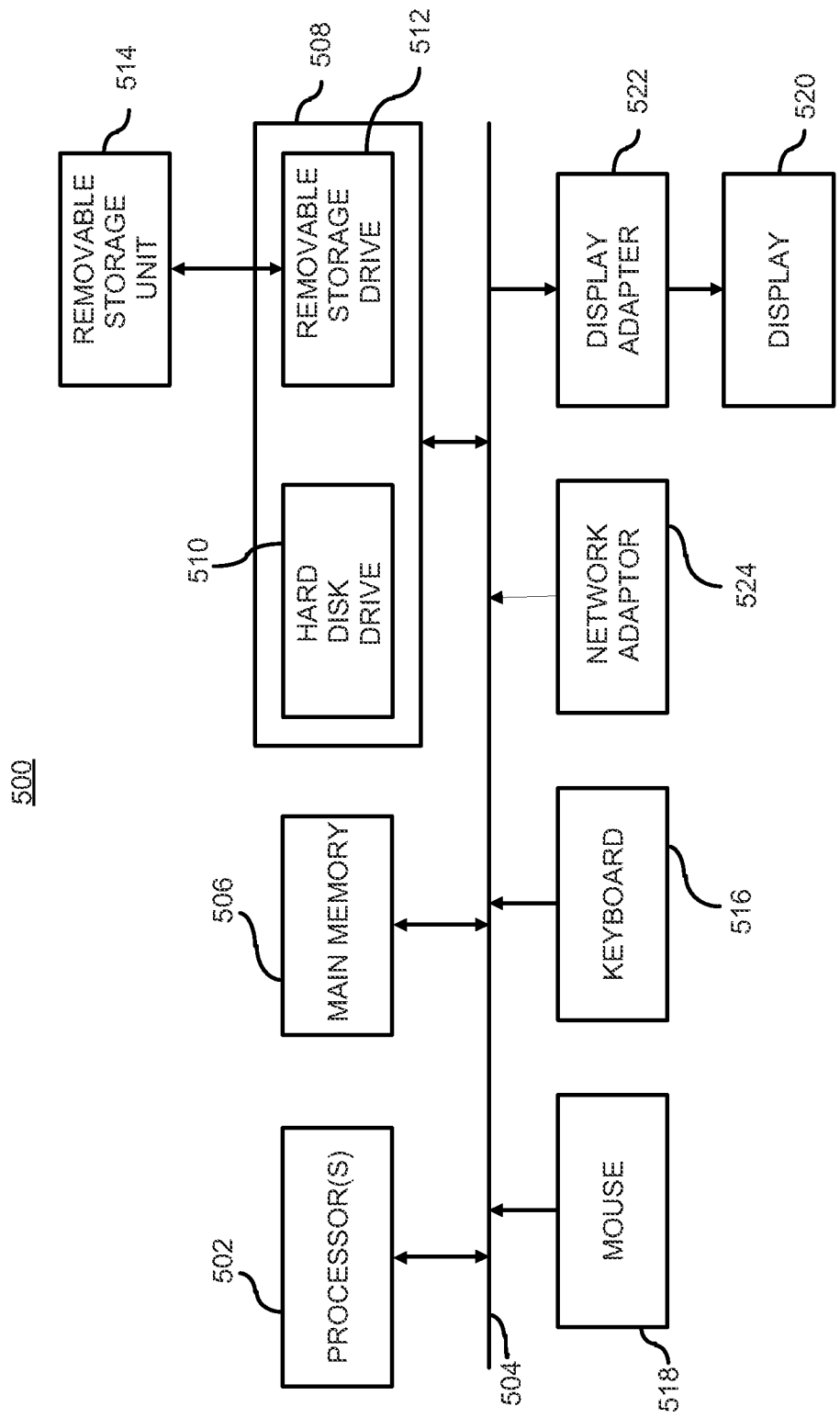
FIG. 5 illustrates a computer system, which may be employed to perform various functions of the management apparatus depicted in FIG. 1 in performing some or all of the steps contained in the flow diagrams depicted in FIGS. 2-4B, according to an example embodiment of the invention.

FIG. 5 illustrates a computer system 500, which may be employed to perform the various functions of the management apparatus 120 described herein above, according to an example. In this respect, the computer system 500 may be used as a platform for executing one or more of the functions described hereinabove with respect to the processor 122 and the modules 126-130.

The computer system 500 includes a processor 502, which may be equivalent to the processor 122 depicted in FIG. 1 and which may be used to execute some or all of the steps described in the methods 200-400. Commands and data from the processor 502 are communicated over a communication bus 504. The computer system 500 also includes a main memory 506, such as a random access memory (RAM), where the program code may be executed during runtime, and a secondary memory 508. The secondary memory 508 includes, for example, one or more hard disk drives 710 and/or a removable storage drive 712, representing a floppy diskette drive, a magnetic tape drive, a compact disk drive, etc.

The removable storage drive 510 reads from and/or writes to a removable storage unit 514 in a well-known manner. User input and output display adaptor 522 may interface with the communication bus 504 and the display 520 and may receive display data from the processor 502 and convert the display data into display commands for the display 520. In addition, the processor 502 may communicate over a network, for instance, the Internet, local area network (LAN), etc., through a network adaptor 524.

It will be apparent to one of ordinary skill in the art that other known electronic components may be added or substituted in the computer system 500. In addition, the computer system 500 may include a system board or blade used in a rack in a data center, a conventional "white box" server or computing device, etc. Also, one or more of the components in FIG. 5 may be optional (for instance, user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the scope of the invention, which is intended to be defined by the following claims—and their equivalents—in which all terms are meant in their broadest reasonable sense unless otherwise indicated.

What is claimed is:

1. A method of managing wear on a plurality of independent storage devices having respective sets of memory cells, said method comprising:
   monitoring access characteristics of the memory cells in the plurality of independent storage devices, wherein monitoring access characteristics includes calculating an average number of accesses per independent storage device for each of the plurality of independent storage devices, and a read/write access ratio of the memory cells;
   receiving an instruction to access data on at least one of the memory cells;
   selecting an independent storage device, of the plurality of independent storage devices, to access data on at least one of the memory cells of the selected independent storage device based upon one or more predetermined selection policies and the monitored access characteristics of the memory cells in the plurality of independent storage devices; and
   assigning the selected independent storage device to access data on at least one of the memory cells of the selected independent storage device according to the received instruction.

2. The method according to claim 1, wherein the one or more predetermined selection policies comprise a selection policy configured to level wear of the memory cells relatively evenly across the plurality of independent storage devices.

3. The method according to claim 2, wherein the one or more predetermined selection policies comprise a selection policy configured to randomly select the independent storage device from the plurality of independent storage devices to level wear relatively evenly across the plurality of independent storage devices.

4. The method according to claim 1, wherein the one or more predetermined selection policies comprise a selection policy to manage lifetimes of the independent storage devices associated with at least one of performance, power efficiency, and reliability of the independent storage devices.

5. The method according to claim 1, wherein the one or more predetermined selection policies comprise a selection policy configured to skew selection of the independent storage device to one or more predetermined independent storage devices, such that the memory cells of the selected independent storage device is accessed a greater number of times as compared with the memory cells of other ones of the plurality of independent storage devices.

6. The method according to claim 1, wherein the plurality of independent storage devices comprise at least two heterogeneous storage devices having different susceptibilities to failure and wherein selecting the independent storage device in accordance with one or more predetermined selection policies further comprises factoring the susceptibilities to failure of the heterogeneous storage devices in selecting the independent storage device.

7. The method according to claim 1, further comprising:
   determining intended applications of the plurality of independent storage devices; and
   wherein selecting the independent storage device in accordance with one or more predetermined selection policies further comprises factoring the intended applications of the plurality of independent storage devices in selecting the independent storage device.

8. The method according to claim 1, wherein multiple ones of the plurality of independent storage devices are configured to store the same data, and wherein selecting the independent storage device in accordance with one or more predetermined selection policies further comprises factoring replication of the data among the multiple ones of the plurality of independent storage devices in selecting the independent storage device.

9. The method according to claim 1, wherein monitoring the access characteristics of the memory cells further comprises monitoring a number of times each of the memory cells is at least one of written to, read from, erased, and a count of the number of memory cells that have failed per storage device.

10. The method according to claim 1, further comprising:
    receiving data pertaining one or more access characteristics of storage devices located in a separate cluster; and
    wherein selecting the independent storage device further comprises selecting device independent storage device based upon the received data along with the monitored access characteristics and the one or more predetermined selection policies.

11. An apparatus for managing wear on a plurality of independent storage devices having respective sets of memory cells, said apparatus comprising:
    a memory on which is stored machine readable instructions to:
       monitor access characteristics of the memory cells in the plurality of independent storage devices and to calculate, using the monitored access characteristics, an average number of accesses per independent storage device for each of the plurality of independent storage devices, and a read/write access ratio of the memory cells;
       receive an instruction to access data on at least one of the memory cells;
       select an independent storage device to be accessed based upon one or more predetermined selection policies and the monitored access characteristics of the memory cells; and assign the selected independent storage device to access data on at least one of the memory cells of the selected independent storage device according to the received instruction; and a processor to implement machine readable instructions.

12. The apparatus according to claim 11, wherein the apparatus comprises one of a network switch and a router.

13. The apparatus according to claim 11, wherein the one or more predetermined selection policies comprise a selection policy to level wear of the memory cells relatively evenly across the plurality of independent storage devices.

14. The apparatus according to claim 11, wherein the one or more predetermined selection policies comprise a selection policy to manage lifetimes of the independent storage devices associated with at least one of performance, power efficiency, and reliability.

15. The apparatus according to claim 11, wherein the one or more predetermined selection policies comprise a selection policy to skew selection of the independent storage device to one or more predetermined independent storage devices, such that the memory cells of the selected independent storage device is at least one of read and manipulated a greater number of times as compared with the memory cells of other ones of the plurality of independent storage devices.

16. The apparatus according to claim 11, wherein the plurality of independent storage devices comprise at least two heterogeneous storage devices having different susceptibilities to failure and wherein the machine readable instructions are to factor the susceptibilities to failure of the heterogeneous storage devices in selecting the independent storage device.

17. The apparatus according to claim 11, wherein the machine readable instructions are to determine intended applications of the plurality of independent storage devices and to factor the intended applications of the plurality of independent storage devices in selecting the independent storage device.

18. The apparatus according to claim 11, wherein multiple ones of the plurality of independent storage devices are to store the same data, and wherein the machine readable instructions are further to factor replication of the data among the multiple ones of the plurality of independent storage devices in selecting the independent storage device.

19. The apparatus according to claim 11, wherein the apparatus is part of a first cluster and wherein the machine readable instructions are to receive data pertaining one or more access characteristics of storage devices located in at least one other cluster separate from the first cluster and wherein the machine readable instructions are to select the independent storage device based upon the received data along with the monitored access characteristics and the one or more predetermined selection policies.

20. A non-transitory computer readable storage medium on which is embedded one or more computer programs that when executed by a processor, implement a method of managing wear on a plurality of independent storage devices having respective sets of memory cells, said one or more computer programs comprising computer code to:

monitor access characteristics of the memory cells in a first cluster comprising a plurality of independent storage devices;

receive data pertaining to one or more access characteristics of independent storage devices located in at least one other cluster separate from the first cluster;

receive an instruction to access data on at least one memory cell;

select from a group comprising the first cluster and the at least one other cluster, an independent storage device to access data on at least one of the memory cells of the selected independent storage device based upon one or more predetermined selection policies, the data received from the at least one other cluster, and the monitored access characteristics of the memory cells in the first cluster of independent storage devices; and assign the selected independent storage device to access data on at least one of the memory cells of the selected independent storage device according to the received instruction.

* * * * *